United States Patent
Yokawa et al.

(10) Patent No.: US 9,538,118 B2
(45) Date of Patent: Jan. 3, 2017

(54) DISPLAY DEVICE

(71) Applicant: Funai Electric Co., Ltd., Daito-shi, Osaka (JP)

(72) Inventors: Akira Yokawa, Daito (JP); Akihiro Fujikawa, Daito (JP); Yasuyuki Fukumoto, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 468 days.

(21) Appl. No.: 14/090,769

(22) Filed: Nov. 26, 2013

(65) Prior Publication Data

US 2014/0152906 A1 Jun. 5, 2014

(30) Foreign Application Priority Data

Nov. 30, 2012 (JP) .................. 2012-261879

(51) Int. Cl.
*H04N 5/655* (2006.01)
*H04N 5/64* (2006.01)
*H05K 7/20* (2006.01)

(52) U.S. Cl.
CPC ............ *H04N 5/655* (2013.01); *H04N 5/64* (2013.01); *H05K 7/209* (2013.01)

(58) Field of Classification Search
CPC ........ H01L 33/64; H01L 33/56; H01L 23/373; H01L 23/4985; H01L 51/529; G02F 1/133615; G02F 1/133308; G02F 1/133305; G02F 1/133603; G02F 1/133385; G02F 1/133608; G02F 1/133382; G02F 1/1336; G02F 1/133524; G02F 2001/133628; G02F 2001/133314; G02F 2001/133317; G02F 2001/13332; G02F 2201/46; G02F 2201/36; G02F 2203/60; G02F 1/1601; G02F 1/20; G02F 1/1333; G02B 6/0085; G02B 6/0088; G02B 6/0068; G02B 6/009; G02B 6/0073; G02B 6/0081; G02B 6/00; G02B 19/0061; H04N 5/64; H04N 5/645; H04N 5/655; H05K 2201/10106; H05K 2201/0162; H05K 2201/10371; H05K 2201/10969; H05K 2201/2018; H05K 2201/10409; H05K 1/181; H05K 1/0203; H05K 1/00; H05K 1/0209; H05K 1/03; H05K 1/182; H05K 7/20972; H05K 7/2039; H05K 7/209; H05K 7/20963; H05K 3/0061; H05K 5/0004; H05K 5/04; F21V 29/004; F21V 29/70; F21V 29/20; F21V 19/001
(Continued)

(56) References Cited

U.S. PATENT DOCUMENTS 8,089,582 B2 1/2012 Sekiguchi et al.
2007/0211191 A1* 9/2007 Cho ..................... G02B 6/0073
349/58
(Continued)

FOREIGN PATENT DOCUMENTS

JP 11-24072 A 1/1999
JP 2006-058679 3/2006
(Continued)

*Primary Examiner* — Thoi Duong
(74) *Attorney, Agent, or Firm* — Crowell & Moring LLP

(57) ABSTRACT

This display device includes a heat radiation member made of metal, configured to radiate heat generated from a light source portion, a rear housing arranged on the rear side of the heat radiation member, a substrate mounting member made of sheet metal, mounted with a circuit substrate, and a cover member covering the substrate mounting member from the rear side of the substrate mounting member in a state where the rear surface of the rear housing is exposed to the outside, while the heat radiation member is arranged to come into contact with the substrate mounting member.

20 Claims, 8 Drawing Sheets

FIRST EMBODIMENT

(58) Field of Classification Search
USPC ......... 349/58, 65, 161, 72; 257/99, E33.075,
257/88; 348/794, 790, 725, 739, 791, 836,
348/E5.096; 362/611, 97.1, 612, 613, 382,
362/294, /84, 97.2, 97.3, 227, 249.01,
362/257, 296.01, 327, 373, 555, 631, 633,
362/634, 615, 632; 165/134.1, 185
See application file for complete search history.

(56) References Cited

U.S. PATENT DOCUMENTS

2010/0066939 A1\* 3/2010 Ohashi ................. G02B 6/0085
349/58
2012/0257107 A1\* 10/2012 Itoh ....................... G02B 6/0085
348/553
2013/0094246 A1\* 4/2013 Kim ........................... G09F 9/35
362/613

FOREIGN PATENT DOCUMENTS

| JP | 2008-10361 A | 1/2008 |
| JP | 2008-130412 A | 6/2008 |
| JP | 2008-153163 | 7/2008 |
| JP | 2008-165101 | 7/2008 |
| JP | 2008-304630 A | 12/2008 |
| JP | 2009-009080 | 1/2009 |
| JP | 2009-104858 A | 5/2009 |
| JP | 2009-192728 A | 8/2009 |

\* cited by examiner

FIG.5 FIRST EMBODIMENT

⇐ : DIRECTION IN WHICH HEAT IS TRANSFERRED

SECOND EMBODIMENT

SECOND EMBODIMENT

DISPLAY DEVICE

BACKGROUND OF THE INVENTION

Field of the Invention

The present invention relates to a display device and a thin television set, and more particularly, it relates to a display device and a thin television set each including a heat radiation member made of metal, configured to radiate heat generated from a light source portion and a rear housing arranged on the rear side of the heat radiation member.

Description of the Background Art

A display device including a heat radiation member made of sheet metal, configured to radiate heat generated from a light source portion and a rear housing arranged on the rear side of the heat radiation member is known in general, as disclosed in Japanese Patent No. 4589368.

Japanese Patent No. 4589368 discloses a liquid crystal display device including a display panel, a light source including LEDs, a light guide plate guiding light from the light source to the display panel, a substrate mounted with the light source, a heat sink (heat radiation member) mounted on a surface of the substrate opposite to the light source, and a rear cover (rear housing) holding the light guide plate and the heat sink from the rear side (a side opposite to the display panel). In this liquid crystal display device, the heat sink is arranged to come into surface contact with the front surface (a surface closer to the display panel) of the rear cover.

In the liquid crystal display device according to Japanese Patent No. 4589368, however, the heat sink is arranged to come into surface contact with the front surface of the rear cover, and hence heat transferred from the light source to the heat sink is disadvantageously easily transferred to the rear cover. Thus, the temperature of a portion (rear cover) that a user's hand touches may conceivably rise.

SUMMARY OF THE INVENTION

The present invention has been proposed in order to solve the aforementioned problem, and an object of the present invention is to provide a display device capable of suppressing a rise in the temperature of a portion that a user's hand touches.

In order to attain the aforementioned object, a display device according to a first aspect of the present invention includes a light source portion, a heat radiation member made of metal, arranged in contact with the light source portion, configured to radiate heat generated from the light source portion, a rear housing arranged on the rear side of the heat radiation member, a substrate mounting member made of sheet metal, mounted on the rear housing, mounted with a circuit substrate, and a cover member covering the substrate mounting member from the rear side of the substrate mounting member in a state where the rear surface of the rear housing is exposed to the outside, while the heat radiation member is arranged to come into contact with the substrate mounting member.

The display device according to the first aspect of the present invention is configured as described above, whereby the heat generated from the light source portion is transferred to the substrate mounting member made of sheet metal through the heat radiation member made of metal to be radiated, and hence transfer of the heat generated from the light source portion to the rear housing can be suppressed. Thus, a rise in the temperature of a portion (rear housing) that a user's hand touches can be suppressed. Furthermore, the substrate mounting member is covered with the cover member, whereby the user's hand does not touch the substrate mounting member whose temperature rises due to the contact with the heat radiation member, and hence a rise in the temperature of a portion (cover member) that the user's hand touches can be suppressed.

In the aforementioned display device according to the first aspect, the rear housing preferably includes a region including an opening or a notch, and the substrate mounting member and the cover member are preferably mounted on the region including the opening or the notch of the rear housing. According to this structure, the substrate mounting member whose temperature rises due to the contact with the heat radiation member is arranged in a region (the region including the opening or the notch) where no rear housing exists, and hence transfer of the heat from the light source portion to the rear housing can be further suppressed.

In this case, the light source portion is preferably arranged on the side of the heat radiation member opposite to the substrate mounting member, and the rear surface of the heat radiation member and the front surface of the rear housing are preferably arranged to be opposed to each other through a space from the side of the light source portion to the side of the substrate mounting member. According to this structure, the space is provided between the rear surface of the heat radiation member and the front surface of the rear housing, and hence heat transferred from the light source portion to the heat radiation member can be further suppressed from being transferred to the rear housing.

In the aforementioned display device in which the rear surface of the heat radiation member and the front surface of the rear housing are arranged to be opposed to each other through the space, a space ensuring rib or a spacer coming into contact with the rear surface of the heat radiation member, having a prescribe length as a distance from the rear housing to the heat radiation member is preferably arranged on the front surface of the rear housing. According to this structure, the space ensuring rib or the spacer having the prescribed length can easily suppress a reduction in the space (interval) between the rear surface of the heat radiation member and the front surface of the rear housing, and hence the heat transferred from the light source portion to the heat radiation member can be easily suppressed from being transferred to the rear housing.

In the aforementioned display device in which the space ensuring rib or the spacer having the prescribe length is arranged, the space ensuring rib protruding to the heat radiation member to come into contact with the rear surface of the heat radiation member, having the prescribed length is preferably integrally formed on the front surface of the rear housing. According to this structure, the heat transferred from the light source portion to the heat radiation member can be reliably suppressed from being transferred to the rear housing without increasing the number of components, unlike the case where the spacer is employed.

In the aforementioned display device in which the space ensuring rib or the spacer having the prescribe length is arranged, the circuit substrate is preferably mounted on the rear side of the substrate mounting member and is preferably arranged to be separated from the cover member by a prescribed distance longer than the prescribed length. According to this structure, in addition to the space between the rear surface of the heat radiation member and the front surface of the rear housing, a space can be provided between the circuit substrate on the rear side of the substrate mounting member and the cover member, and hence heat from the substrate mounting member whose temperature rises due to the contact with the heat radiation member can be easily suppressed from being transferred to the portion (cover member) that the user's hand touches while the heat transferred from the light source portion to the heat radiation member is suppressed from being transferred to the rear housing.

In the aforementioned display device in which the rear housing includes the region including the opening or the notch, the rear housing preferably has a rectangular outer shape, the light source portion is preferably arranged along an end side extending in a vertical direction of the rear housing having the rectangular outer shape, the substrate mounting member is preferably arranged in the vicinity of a central portion of the rear housing, and the heat radiation member is preferably formed to extend in a horizontal direction from the side of the light source portion to the side of the substrate mounting member. According to this structure, in the side edge light type display device having the light source portion arranged along the end side extending in the vertical direction of the rear housing, the heat from the light source portion can be easily transferred to the substrate mounting member in the vicinity of the central portion of the rear housing through the heat radiation member extending in the horizontal direction (transverse direction) from the side of the light source portion to the side of the substrate mounting member.

In this case, the region including the opening or the notch of the rear housing preferably has a rectangular shape, and the heat radiation member is preferably formed to extend along the end side extending in the vertical direction of the rear housing having the rectangular outer shape, extend in the horizontal direction from the side of the light source portion to the side of the substrate mounting member, and extend in the vertical direction along an end side extending in the vertical direction of the region including the opening or the notch having the rectangular shape. According to this structure, the heat radiation member is formed to extend also in the vertical direction, so that the heat radiation area of the heat radiation member can be increased, unlike the case where the heat radiation member is formed to extend only in the horizontal direction. Therefore, the heat radiation effect of the heat radiation member can be improved.

In the aforementioned display device in which the region including the opening or the notch of the rear housing has the rectangular shape, the substrate mounting member preferably has a rectangular shape corresponding to that of the region including the opening or the notch having the rectangular shape of the rear housing, and the heat radiation member preferably extends in the vertical direction along an end side extending in the vertical direction of the substrate mounting member having the rectangular shape to be longer than the end side extending in the vertical direction of the substrate mounting member. According to this structure, the heat radiation member extends in the vertical direction to be longer than the end side extending in the vertical direction of the substrate mounting member, so that a larger contact area between the substrate mounting member and the heat radiation member can be easily obtained. Therefore, the heat transferred from the light source portion to the heat radiation member can be reliably transferred to the substrate mounting member to be radiated.

In the aforementioned display device according to the first aspect, the heat radiation member is preferably arranged to come into contact with the substrate mounting member by holding the substrate mounting member between the heat radiation member and the rear housing in a state where the heat radiation member is fastened to the rear housing by a fastening member. According to this structure, the substrate mounting member is held between the heat radiation member and the rear housing, and hence the heat radiation member and the substrate mounting member can be stably brought into contact with each other. Thus, the heat transferred from the light source portion to the heat radiation member can be reliably transferred to the substrate mounting member to be radiated.

In this case, the substrate mounting member held between the heat radiation member and the rear housing and the vicinity of a portion of the heat radiation member fastened by the fastening member are preferably arranged to come into surface contact with each other. According to this structure, the heat radiation member and the substrate mounting member come into surface contact with each other, so that a heat transfer area for heat transfer can be increased, unlike the case where the heat radiation member and the substrate mounting member come into point contact with each other. Consequently, heat can be efficiently transferred from the light source portion to the substrate mounting member.

In the aforementioned display device according to the first aspect, a stiffening rib separated from the rear surface of the heat radiation member without contact is preferably formed on the front surface of the rear housing to extend in a vertical direction. According to this structure, the rigidity of the rear housing separated from the heat radiation member can be easily improved while transfer of heat from the heat radiation member to the rear housing is suppressed.

In the aforementioned display device in which the heat radiation member extends in the horizontal direction and the vertical direction, a heat radiation fin extending from the vicinity of the upper end of the rear surface of the heat radiation member to the vicinity of the lower end of the rear surface of the heat radiation member is preferably integrally formed on the rear surface of the heat radiation member, and an air hole is preferably formed in each of portions of the rear housing corresponding to the upper end and the lower end of the heat radiation fin. According to this structure, the heat radiation area of the heat radiation member can be further increased by the surface area of the heat radiation fin, and hence the heat radiation effect of the heat radiation member can be further improved. Furthermore, the air hole is formed in each of the portions of the rear housing corresponding to the upper end and the lower end of the heat radiation fin, whereby relatively hot air in the vicinity of the heat radiation fin flows out of the rear housing through the upper air hole of the rear housing while relatively cool air outside the rear housing flows in the rear housing through the lower air hole of the rear housing (chimney effect), and hence the heat radiation effect can be further improved.

In this case, the heat radiation fin is preferably formed to protrude and extend from the rear surface of the heat radiation member toward the rear housing, and an end of the heat radiation fin closer to the rear housing is preferably formed to be separated from the front surface of the rear housing without contact. According to this structure, the heat radiation fin is formed to protrude and extend from the rear surface of the heat radiation member toward the rear housing, whereby the heat radiation area of the heat radiation member can be further increased, and hence the heat radiation effect of the heat radiation member can be further improved. Furthermore, the end of the heat radiation fin closer to the rear housing is formed to be separated from the front surface of the rear housing without contact, whereby transfer of the heat generated from the light source portion to the rear housing through the heat radiation member can be suppressed even in the case where the heat radiation fin is provided.

In the aforementioned display device according to the first aspect, the heat radiation member preferably has an end bent in an L-shape on an opposite side to the substrate mounting member and includes a light source mounting portion configured to mount the light source portion on the end bent in the L-shape, and the light source portion is preferably mounted on the light source mounting portion of the heat radiation member through a heat radiation tape for heat radiation. According to this structure, the light source portion is mounted on the light source mounting portion of the heat radiation member through the heat radiation tape, so that heat can be efficiently transferred from the light source portion to the heat radiation member. In the side edge light type thin display device in which a side end surface of the light guide plate receives light, for example, the light source portion can be mounted on the light source mounting portion of the heat radiation member bent in the L-shape along the light guide plate, and hence an increase in the thickness of the display device can be suppressed while the heat radiation property is improved.

A thin television set according to a second aspect of the present invention is a television set receiving television broadcasting and includes a light source portion, a heat radiation member made of metal, arranged in contact with the light source portion, configured to radiate heat generated from the light source portion, a rear housing arranged on the rear side of the heat radiation member, a substrate mounting member made of sheet metal, mounted on the rear housing, mounted with a circuit substrate, and a cover member covering the substrate mounting member from the rear side of the substrate mounting member in a state where the rear surface of the rear housing is exposed to the outside, while the heat radiation member is arranged to come into contact with the substrate mounting member.

The thin television set according to the second aspect of the present invention is configured as described above, whereby the heat generated from the light source portion is transferred to the substrate mounting member made of sheet metal through the heat radiation member made of metal to be radiated, and hence transfer of the heat generated from the light source portion to the rear housing can be suppressed. Thus, a rise in the temperature of a portion (rear housing) that a user's hand touches can be suppressed. Furthermore, the substrate mounting member is covered with the cover member, whereby the user's hand does not touch the substrate mounting member whose temperature rises due to the contact with the heat radiation member, and hence a rise in the temperature of a portion (cover member) that the user's hand touches can be suppressed.

In the aforementioned thin television set according to the second aspect, the rear housing preferably includes a region including an opening or a notch, and the substrate mounting member and the cover member are preferably mounted on the region including the opening or the notch of the rear housing. According to this structure, the substrate mounting member whose temperature rises due to the contact with the heat radiation member is arranged in a region (the region including the opening or the notch) where no rear housing exists, and hence transfer of the heat from the light source portion to the rear housing can be further suppressed.

In this case, the light source portion is preferably arranged on the side of the heat radiation member opposite to the substrate mounting member, and the rear surface of the heat radiation member and the front surface of the rear housing are preferably arranged to be opposed to each other through a space from the side of the light source portion to the side of the substrate mounting member. According to this structure, the space is provided between the rear surface of the heat radiation member and the front surface of the rear housing, and hence heat transferred from the light source portion to the heat radiation member can be further suppressed from being transferred to the rear housing.

In the aforementioned thin television set in which the rear surface of the heat radiation member and the front surface of the rear housing are arranged to be opposed to each other through the space, a space ensuring rib or a spacer coming into contact with the rear surface of the heat radiation member, having a prescribe length as a distance from the rear housing to the heat radiation member is preferably arranged on the front surface of the rear housing. According to this structure, the space ensuring rib or the spacer having the prescribed length can easily suppress a reduction in the space (interval) between the rear surface of the heat radiation member and the front surface of the rear housing, and hence the heat transferred from the light source portion to the heat radiation member can be easily suppressed from being transferred to the rear housing.

In the aforementioned thin television set in which the space ensuring rib or the spacer having the prescribe length is arranged, the space ensuring rib protruding to the heat radiation member to come into contact with the rear surface of the heat radiation member, having the prescribed length is preferably integrally formed on the front surface of the rear housing. According to this structure, the heat transferred from the light source portion to the heat radiation member can be reliably suppressed from being transferred to the rear housing without increasing the number of components, unlike the case where the spacer is employed.

According to the present invention, as hereinabove described, a rise in the temperature of the portion that the user's hand touches can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

(First Embodiment)

The structure of a liquid crystal television set 100 according to a first embodiment of the present invention is now described with reference to FIGS. 1 to 9. The liquid crystal television set 100 is an example of the "display device" in the present invention.

Figure 1:
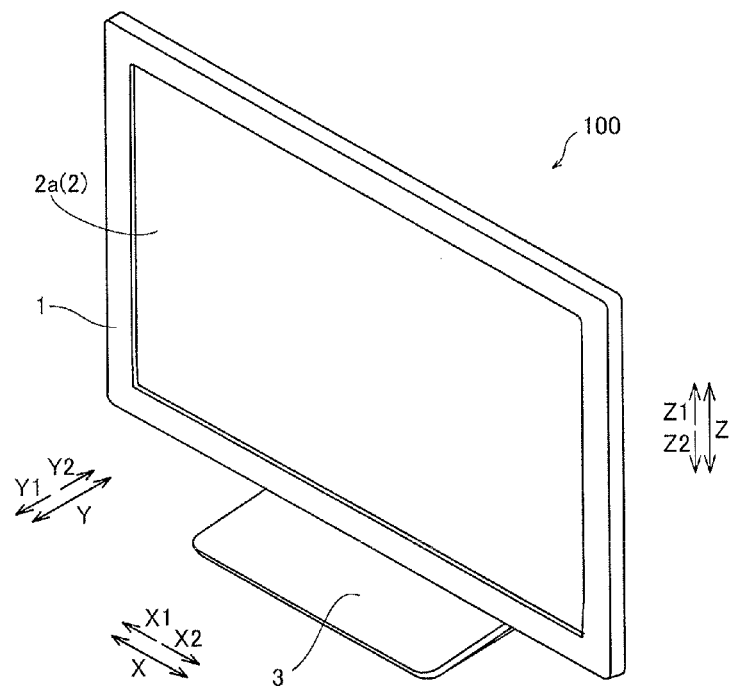
FIG. 1 is a perspective view showing the overall structure of a liquid crystal television set according to a first embodiment of the present invention.
Figure 2:
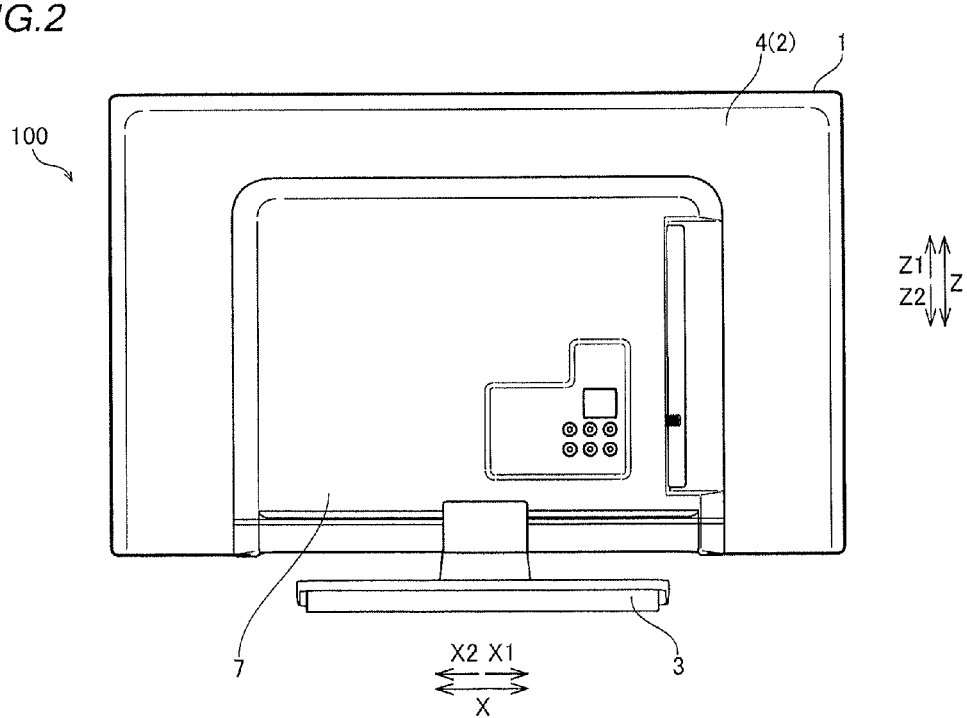
FIG. 2 is a rear view of the liquid crystal television set according to the first embodiment of the present invention.

As shown in FIGS. 1 and 2, the liquid crystal television set 100 includes a front housing 1 having a rectangular shape as viewed from the front side (Y1 side), formed in a frame shape, a display panel 2 having a display portion 2a including a display cell (liquid crystal cell) on which a picture is displayed, and a stand member 3 supporting the liquid crystal television set 100 from below (Z2 side). The front housing 1 and the stand member 3 are made of resin.

Figure 3:
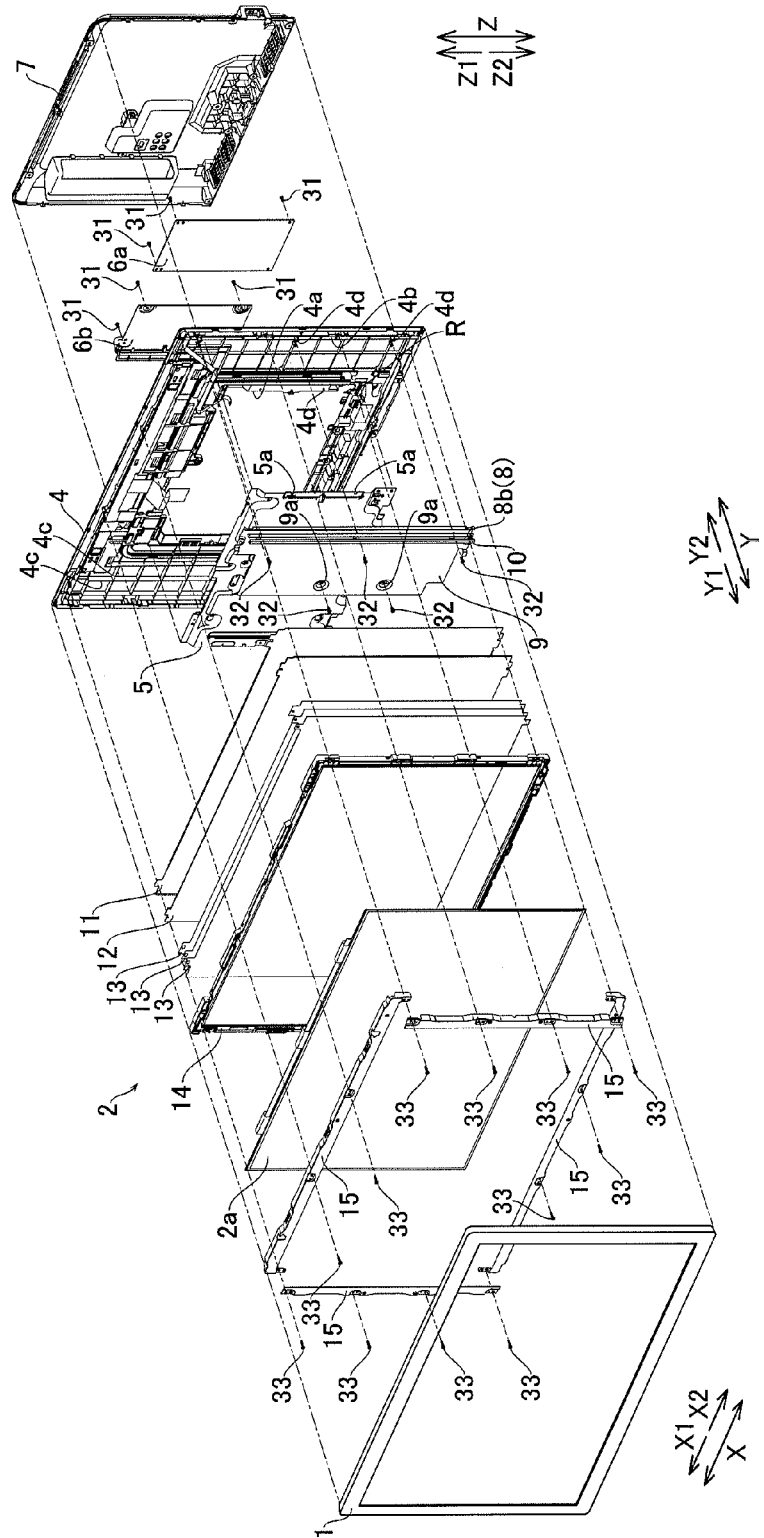
FIG. 3 is an exploded perspective view showing the liquid crystal television set according to the first embodiment of the present invention as viewed from the front side.
Figure 4:
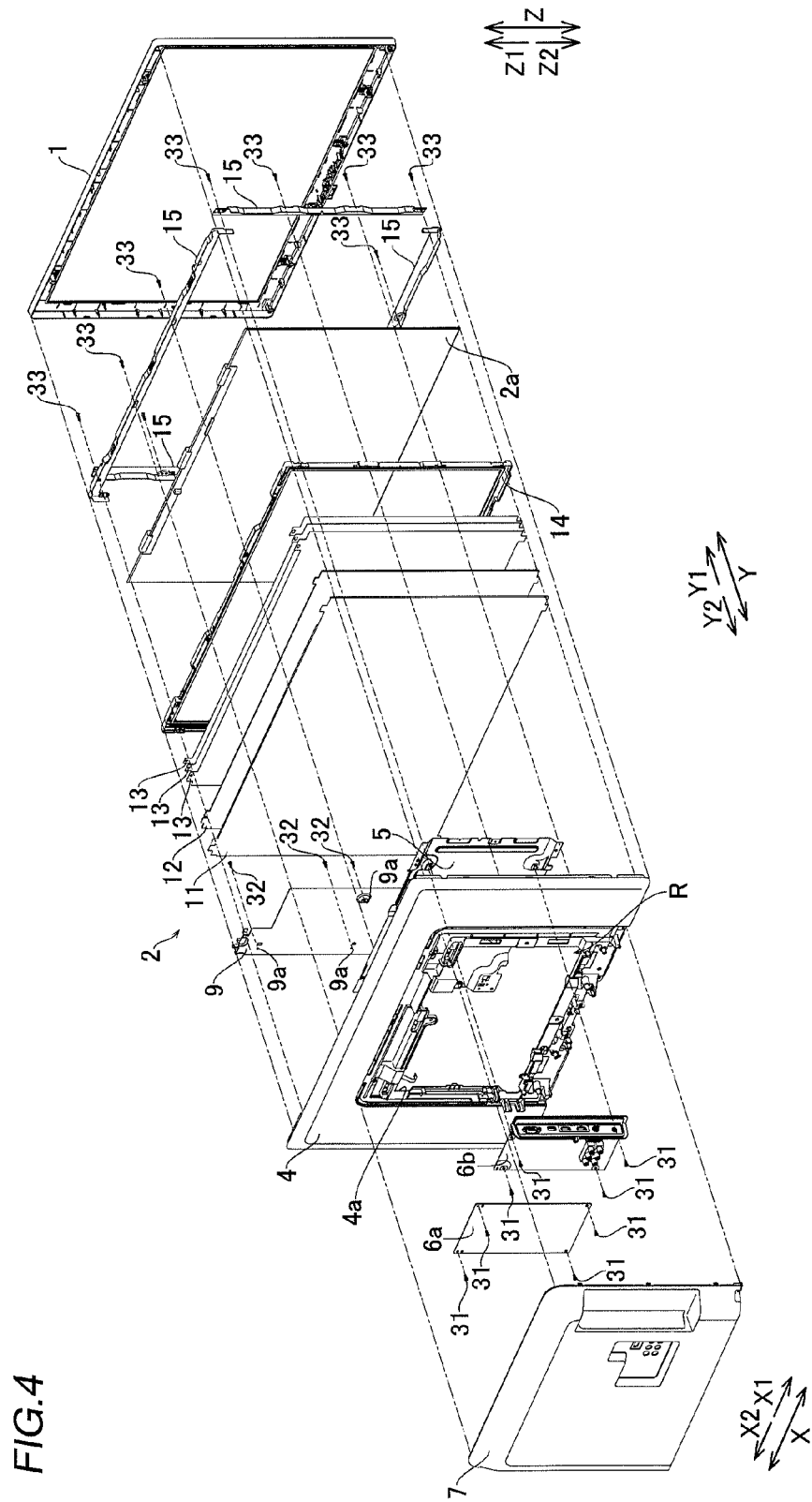
FIG. 4 is an exploded perspective view showing the liquid crystal television set according to the first embodiment of the present invention as viewed from the rear side.

As shown in FIGS. 2 to 4, a rear frame 4 made of resin, holding the display portion 2a from the rear side is arranged on the rear side (Y2 side) of the front housing 1. According to the first embodiment, the rear frame 4 is formed in a frame shape having a rectangular outer shape corresponding to that of the front housing 2, as shown in FIGS. 3 and 4. Specifically, a rectangular opening 4a to which a substrate mounting member 5 made of sheet metal, described later is mounted is formed in the vicinity of a central portion (a portion slightly lower (Z2 side) than the central portion) of the rear frame 4.

As shown in FIGS. 3 and 4, the substrate mounting member 5 has a rectangular shape corresponding to that of the opening 4a of the rear frame 4. This substrate mounting member 5 is mounted on the rear frame 4 to close the opening 4a of the rear frame 4 from the front side (Y1 side). Furthermore, a power supply substrate 6a and a signal processing substrate 6b are mounted in a horizontal direction (direction X) on the rear surface (a surface on the Y2 side) of the substrate mounting member 5. These power supply substrate 6a and signal processing substrate 6b are fixed (fastened) to the rear surface of the substrate mounting member 5 through screw members 31 to be grounded through the substrate mounting member 5. The power supply substrate 6a and the signal processing substrate 6b are examples of the "circuit substrate" in the present invention.

As shown in FIGS. 3 and 4, a cover member 7 made of resin is mounted on a region R including the opening 4a in the vicinity of the central portion of the rear frame 4 from the rear side (Y2 side). This cover member 7 has a rectangular shape smaller than that of the rear frame 4. Thus, the cover member 7 is configured to cover the substrate mounting member 5 from the rear side in a state where the rear surface of the rear frame 4 is exposed. In this manner, according to the first embodiment, the rear housing corresponding to the front housing 1 is constituted by the rear frame 4 and the cover member 7. In other words, the rear frame 4 is an example of the "rear housing" in the present invention. The front housing 1 is fixed to the rear frame 4 by screw members (not shown).

Figure 5:
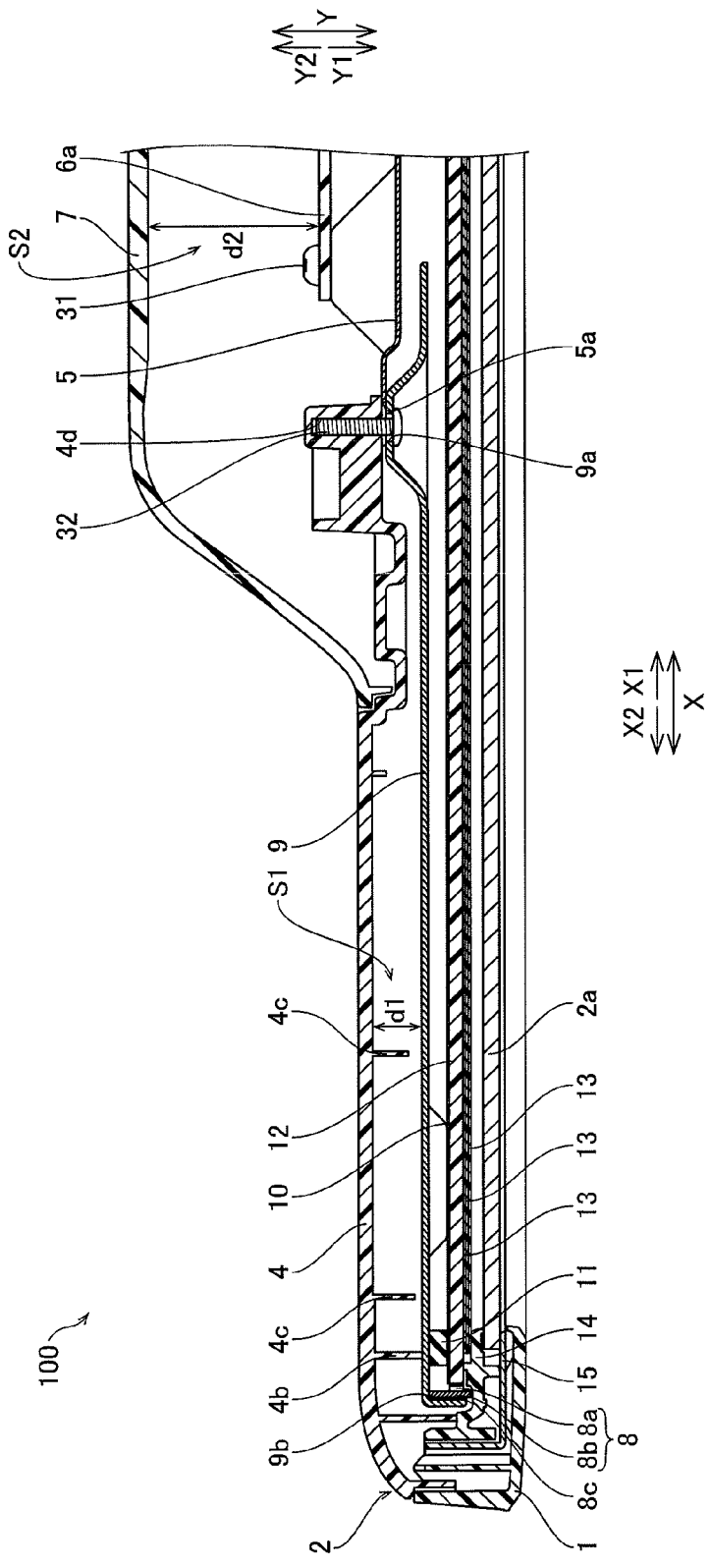
FIG. 5 is a schematic sectional view of the liquid crystal television set according to the first embodiment of the present invention taken horizontally.

As shown in FIGS. 3 and 5, a heat sink 9 made of sheet metal mounted with a light source portion 8, described later, including a plurality of LEDs (light emitting diodes) 8a emitting light is arranged on the front surface (a surface on the Y1 side) of the rear frame 4. The heat sink 9 is an example of the "heat radiation member" in the present invention.

Figure 6:
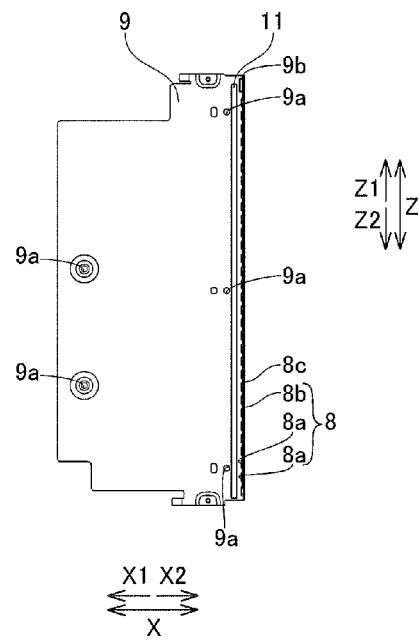
FIG. 6 is a front view of a heat sink of the liquid crystal television set according to the first embodiment of the present invention.
Figure 7:
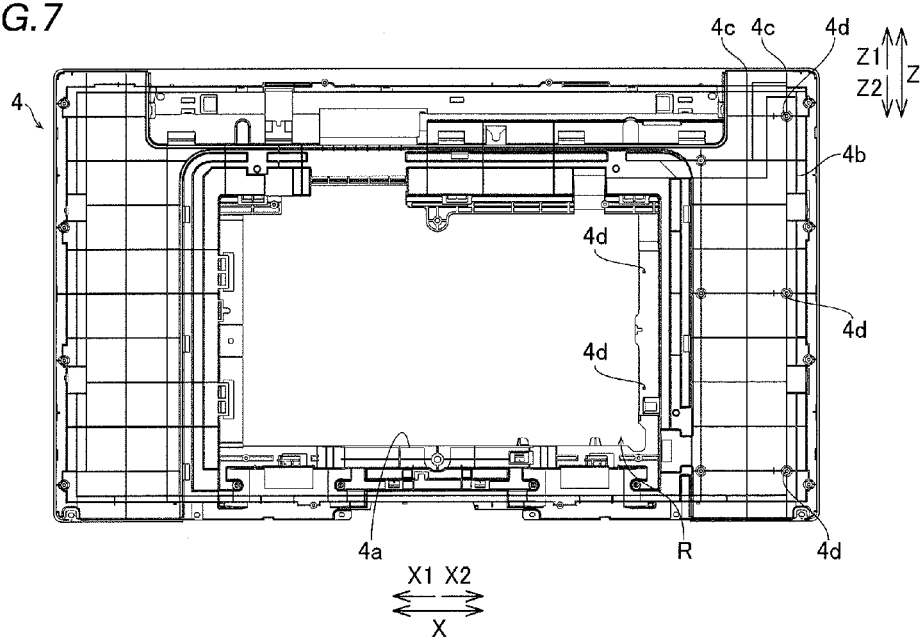
FIG. 7 is a front view of a rear frame of the liquid crystal television set according to the first embodiment of the present invention.
Figure 8:
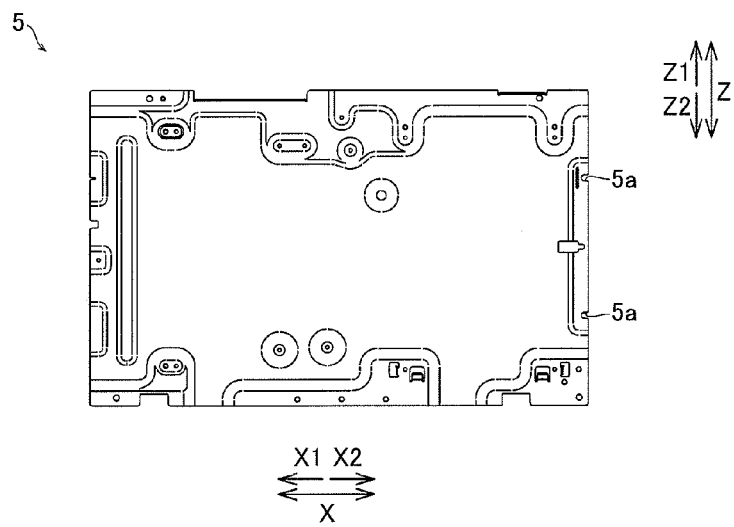
FIG. 8 is a front view of a substrate mounting member of the liquid crystal television set according to the first embodiment of the present invention.

As shown in FIGS. 3 and 5, the heat sink 9 is fixed (fastened) to the front surface of the rear frame 4 by screw members 32. Specifically, three screw insertion holes 9a into which the screw members 32 are inserted are formed at intervals in a vertical direction (direction Z) in the vicinity of an end of the heat sink 9 closer to the light source portion 8 (X2 side), as shown in FIG. 6. In addition, two screw insertion holes 9a into which the screw members 32 are inserted are formed at intervals in the vertical direction also in the vicinity of a central portion of an end of the heat sink 9 opposite (X1 side) to the light source portion 8. As shown in FIG. 7, screw holes 4d engaging with the screw members 32 are formed at positions of the front surface of the rear frame 4 corresponding to a total of five screw insertion holes 9a.

As shown in FIG. 5, the heat sink 9 has an L-shaped section including a long portion extending in the horizontal direction (direction X) along the rear frame 4 and a short portion upstanding vertically (to the Y1 side) from an end of the long portion opposite (X2 side) to the substrate mounting member 5. An elastic supporting member 11 configured to support a reflective sheet 10 described later from the rear side is arranged on the front surface of the long portion of the heat sink 9 having the L-shaped section. A light source mounting portion 9b configured to mount the light source portion 8 is formed on a surface closer to the light source portion 8 (a surface on the X1 side) of the short portion of the heat sink 9 having the L-shaped section.

As shown in FIGS. 3 to 5, the reflective sheet 10 reflecting light from the LEDs 8a to the display portion 2a, a light guide plate 12 guiding light from the LEDs 8a to the display portion 2a, a plurality of optical sheets 13 including a light diffusion sheet, a lens sheet, etc., a rectangular resin frame 14 formed in a frame shape, the display portion 2a having a rectangular shape, and four bezels 15 extending along the four sides of the display portion 2a having the rectangular shape are arranged on the front side (Y1 side) of the heat sink 9 and the rear side (Y2 side) of the front housing 1.

As shown in FIGS. 3 and 4, the four bezels 15 are fixed (fastened) to the front surface (the surface on the Y1 side) of the rear frame 4 by a plurality of screw members 33. Thus, the heat sink 9 mounted with the light source portion 8, the reflective sheet 10, the light guide plate 12, the plurality of optical sheets 13, the resin frame 14, and the display portion 2a are held between the four bezels 15 and the rear frame 4. Consequently, according to the first embodiment, the display panel 2 as one module is constituted by the heat sink 9 mounted with the light source portion 8, the reflective sheet 10, the light guide plate 12, the plurality of optical sheets 13, the resin frame 14, the display portion 2a, the four bezels 15, and the rear frame 4.

As shown in FIGS. 3 and 5, the light source portion 8 includes the LEDs 8a emitting light and an LED substrate 8b mounted with the LEDs 8a. This light source portion 8 is arranged on the side of the heat sink 9 opposite (X2 side) to the substrate mounting member 5. Specifically, the light source portion 8 is arranged along an end side (a side extending in the direction Z of an end on the X2 side) of the rectangular rear frame 4 extending in the vertical direction, as shown in FIG. 3. In other words, the liquid crystal television set 100 according to the first embodiment is a side edge light type display device having the light source portion 8 arranged on the side.

As shown in FIG. 6, the plurality of LEDs 8*a* are mounted at intervals along an extensional direction (direction Z) of the LED substrate 8*b* on a surface of the LED substrate 8*b* closer to the light guide plate 12 (X1 side). Thus, the plurality of LEDs 8*a* are configured to emit light to an end surface of the rectangular light guide plate 12 closer to the heat sink 9 (X2 side), as shown in FIG. 5.

As shown in FIG. 5, the back surface of the LED substrate 8*b* opposite (X2 side) to the LEDs 8*a* is fixed (bonded) to the light source mounting portion 9*b* of the heat sink 9 through a heat radiation tape 8*c*. Thus, the light source mounting portion 9*b* of the heat sink 9 is arranged in contact with the light source portion 8 (the LEDs 8*a* and the LED substrate 8*b*) through the heat radiation tape 8*c*. The LEDs 8*a* are configured to generate heat in the normal use of the liquid crystal television set 100 (in a state where the LEDs 8*a* emit light to the light guide plate 12 to display a picture on the display portion 2*a*).

According to the first embodiment, the heat sink 9 is arranged to come into contact with the substrate mounting member 5 by extending in the horizontal direction (direction X) from the side of the light source portion 8 to the side of the substrate mounting member 5, as shown in FIGS. 3 to 5. Specifically, the heat sink 9 is formed to extend along an end side on a side (X2 side) where the light source portion 8 of the rear frame 4 is arranged, extend in the horizontal direction from the side of the light source portion 8 to the side of the substrate mounting member 5, and extend in the vertical direction (direction Z) along an end side closer to the heat sink 9 (X2 side) of the opening 4*a* of the rear frame 4, as shown in FIGS. 3 and 4. Furthermore, the heat sink 9 is formed such that an end side thereof closer to the substrate mounting member 5 (X1 side), extending in the vertical direction is longer than an end side of the substrate mounting member 5 closer to the light source portion 8 (X2 side), extending in the vertical direction. As shown in FIG. 5, the vicinity of an end of the substrate mounting member 5 closer to the light source portion 8 (X2 side) is held between the vicinity of the end of the heat sink 9 opposite (X1 side) to the light source portion 8 and the rear frame 4.

Figure 9:
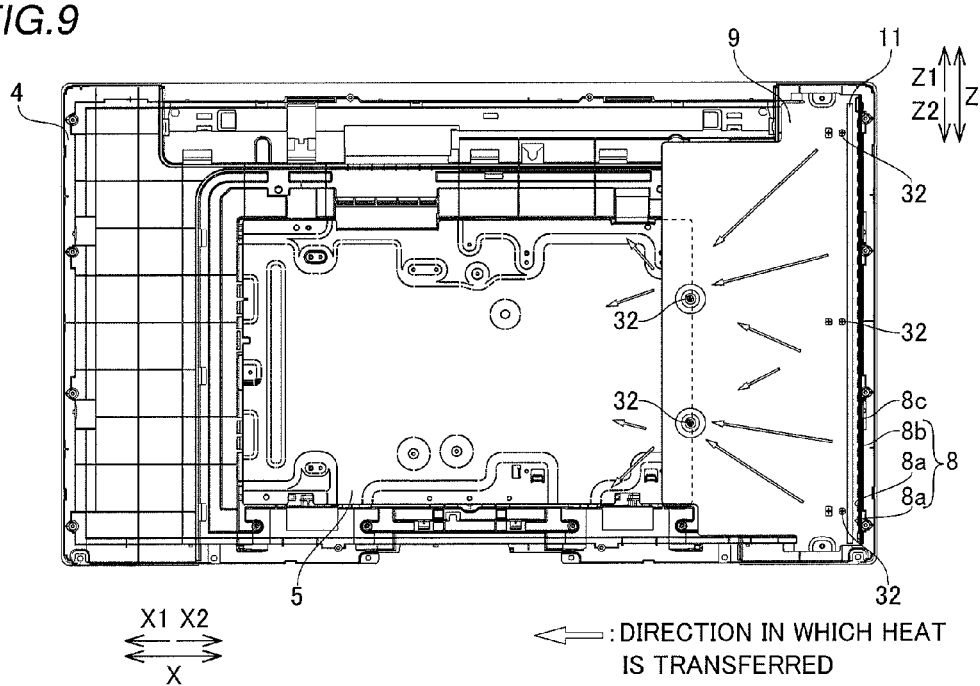
FIG. 9 is a front view showing a state where the heat sink is screwed to the rear frame mounted with the substrate mounting member in the liquid crystal television set according to the first embodiment of the present invention.

In other words, according to the first embodiment, two notches 5*a* corresponding to the two screw insertion holes 9*a* (see FIG. 6) formed in the vicinity of the end of the heat sink 9 opposite (X1 side) to the light source portion 8 and the two screw holes 4*d* (see FIG. 7) of the rear frame 4 corresponding to these two screw insertion holes 9*a* are formed in the vicinity of the end of the substrate mounting portion 5 closer to the light source portion 8 (X2 side), as shown in FIGS. 5 and 7. As shown in FIGS. 5 and 9, the vicinities of the notches 5*a* of the substrate mounting member 5 are held between the vicinities of the screw insertion holes 9*a* of the heat sink 9 and the rear frame 4 in a state where the heat sink 9 is fixed (fastened) to the rear frame 4 by the screw members 32. Thus, the vicinities of the notches 5*a* of the substrate mounting member 5 and the vicinities of the screw insertion holes 9*a* of the heat sink 9 are arranged in surface contact with each other. Consequently, as shown in FIG. 9 (see a void arrow), heat generated from the LEDs 8*a* of the light source portion 8 is radiated through the substrate mounting member 5 after the heat is transferred to the substrate mounting member 5 through the heat sink 9.

According to the first embodiment, the rear surface (a surface on the Y2 side) of the heat sink 9 and the front surface (the surface on the Y1 side) of the rear frame 4 are arranged to be opposed to each other through a scape S1 a space having an interval d1 in an anteroposterior direction (direction Y)) from the side of the light source portion 8 to the side of the substrate mounting member 5, as shown in FIG. 5. A rib 4*b* protruding to the heat sink 9 (Y1 side) to come into contact with the rear surface of the heat sink 9 is integrally formed on the front surface of the rear frame 4. This rib 4*b* is provided to keep the interval d1 of the space S1 between the rear surface of the heat sink 9 and the front surface of the rear frame 4 substantially constant. In addition to the rib 4*b*, a plurality of ribs 4*c* configured to increase the rigidity of the rear frame 4 are integrally formed on the front surface of the rear frame 4. The ribs 4*c* are formed to extend in the vertical direction (direction Z) along the end side of the rear frame 4. The interval d1 is an example of the "prescribed length" in the present invention. The rib 4*b* is an example of the "space ensuring rib" in the present invention. The ribs 4*c* are examples of the "stiffening rib" in the present invention.

According to the first embodiment, the power supply substrate 6*a* and the signal processing substrate 6*b* are arranged to be separated from the cover member 7 by an interval d2 longer than the interval d1 in a state where the power supply substrate 6*a* and the signal processing substrate 6*b* (see FIG. 4) are mounted on the rear side (Y2 side) of the substrate mounting member 5, as shown in FIG. 5. Thus, a space S2 is formed between the power supply substrate 6*a* and the cover member 7 and between the signal processing substrate 6*b* and the cover member 7 on the rear side (Y2 side) of the substrate mounting member 5. The interval d2 is an example of the "prescribed distance" in the present invention.

According to the first embodiment, as hereinabove described, the heat sink 9 is arranged to come into contact with the substrate mounting member 5, whereby the heat generated from the light source portion 8 (LEDs 8*a*) is transferred to the substrate mounting member 5 made of sheet metal through the heat sink 9 made of sheet metal to be radiated, and hence transfer of the heat generated from the light source portion 8 to the rear frame 4 can be suppressed. Thus, a rise in the temperature of a portion (rear frame 4) that a user's hand touches can be suppressed. Furthermore, the substrate mounting member 5 is covered with the cover member 7, whereby the user's hand does not touch the substrate mounting member 5 whose temperature rises due to the contact with the heat sink 9, and hence a rise in the temperature of a portion (cover member 7) that the user's hand touches can be suppressed.

According to the first embodiment, as hereinabove described, the substrate mounting member 5 and the cover member 7 are mounted on the region R including the opening 4*a* of the rear frame 4. Thus, the substrate mounting member 5 whose temperature rises due to the contact with the heat sink 9 is arranged in a region (the region R including the opening 4*a*) where no rear frame 4 exists, and hence transfer of the heat from the light source portion 8 to the rear frame 4 can be further suppressed.

According to the first embodiment, as hereinabove described, the rear surface (the surface on the Y2 side) of the heat sink 9 and the front surface (the surface on the Y1 side)

of the rear frame 4 are arranged to be opposed to each other through the space S1 in the horizontal direction from the side of the light source portion 8 to the side of the substrate mounting member 5. Thus, the space S1 is provided between the rear surface of the heat sink 9 and the front surface of the rear frame 4, and hence the heat transferred from the light source portion 8 to the heat sink 9 can be further suppressed from being transferred to the rear frame 4.

According to the first embodiment, as hereinabove described, the rib 4b coming into contact with the rear surface of the heat sink 9, having the interval d1 as a distance from the rear frame 4 to the heat sink 9 is arranged on the front surface of the rear frame 4. Thus, the rib 4b having the interval d1 can easily suppress a reduction in the space S1 (interval d1) between the rear surface of the heat sink 9 and the front surface of the rear frame 4, and hence the heat transferred from the light source portion 8 to the heat sink 9 can be easily suppressed from being transferred to the rear frame 4.

According to the first embodiment, as hereinabove described, the rib 4b protruding to the heat sink 9 (Y1 side) to come into contact with the rear surface of the heat sink 9, having the interval d1 is integrally formed on the front surface (the surface on the Y1 side) of the rear frame 4. Thus, the heat transferred from the light source portion 8 to the heat sink 9 can be reliably suppressed from being transferred to the rear frame 4 without increasing the number of components, unlike the case where a spacer is employed.

According to the first embodiment, as hereinabove described, the power supply substrate 6a and the signal processing substrate 6b are mounted on the rear side (Y2 side) of the substrate mounting member 5 and are arranged to be separated from the cover member 7 by the interval d2 longer than the interval d1. Thus, in addition to the space S1 between the rear surface of the heat sink 9 and the front surface of the rear frame 4, the space S2 can be provided between the power supply substrate 6a on the rear side (Y2 side) of the substrate mounting member 5 and the cover member 7 and between the signal processing substrate 6b on the rear side (Y2 side) of the substrate mounting member 5 and the cover member 7, and hence heat from the substrate mounting member 5 whose temperature rises due to the contact with the heat sink 9 can be easily suppressed from being transferred to the portion (cover member 7) that the user's hand touches while the heat transferred from the light source portion 8 to the heat sink 9 is suppressed from being transferred to the rear frame 4.

According to the first embodiment, as hereinabove described, the light source portion 8 is arranged along the end side (the side extending in the direction Z of the end on the X2 side) extending in the vertical direction of the rear frame 4 having the rectangular outer shape, the substrate mounting member 5 is arranged in the vicinity of the central portion of the rear frame 4, and the heat sink 9 is formed to extend in the horizontal direction (direction X) from the side of the light source portion 8 to the side of the substrate mounting member 5. Thus, in the side edge light type liquid crystal television set 100 having the light source portion 8 arranged along the end side extending in the vertical direction of the rear frame 4, the heat from the light source portion 8 can be easily transferred to the substrate mounting member 5 in the vicinity of the central portion of the rear frame 4 through the heat sink 9 extending in the horizontal direction (transverse direction) from the side of the light source portion 8 to the side of the substrate mounting member 5.

According to the first embodiment, as hereinabove described, the heat sink 9 is formed to extend along the end side (the side extending in the direction Z of the end on the X2 side) extending in the vertical direction of the rear frame 4 having the rectangular outer shape, extend in the horizontal direction (direction X) from the side of the light source portion 8 to the side of the substrate mounting member 5, and extend in the vertical direction (direction Z) along the end side extending in the vertical direction of the region R including the rectangular opening 4a of the rear frame 4. Thus, the heat sink 9 is formed to extend also in the vertical direction, so that the heat radiation area of the heat sink 9 can be increased, unlike the case where the heat sink 9 is formed to extend only in the horizontal direction. Therefore, the heat radiation effect of the heat sink 9 can be improved.

According to the first embodiment, as hereinabove described, the substrate mounting member 5 has the rectangular shape corresponding to that of the region R including the rectangular opening 4a of the rear frame 4, and the heat sink 9 extends in the vertical direction along the end side extending in the vertical direction of the substrate mounting member 5 having the rectangular shape to be longer than the end side extending in the vertical direction of the substrate mounting member 5. Thus, the heat sink 9 extends in the vertical direction to be longer than the end side extending in the vertical direction of the substrate mounting member 5, so that a larger contact area between the substrate mounting member 5 and the heat sink 9 can be easily obtained. Therefore, the heat transferred from the light source portion 8 to the heat sink 9 can be reliably transferred to the substrate mounting member 5 to be radiated.

According to the first embodiment, as hereinabove described, the heat sink 9 is arranged to come into contact with the substrate mounting member 5 by fastening the heat sink 9 to the rear frame 4 by the screw members 32 and holding the substrate mounting member 5 between the heat sink 9 and the rear frame 4. Thus, the substrate mounting member 5 is held between the heat sink 9 and the rear frame 4, and hence the heat sink 9 and the substrate mounting member 5 can be stably brought into contact with each other. Thus, the heat transferred from the light source portion 8 to the heat sink 9 can be reliably transferred to the substrate mounting member 5 to be radiated.

According to the first embodiment, as hereinabove described, the substrate mounting member 5 held between the heat sink 9 and the rear frame 4 and the vicinity of a portion of the heat sink 9 fastened by the screw members 32 are arranged to come into surface contact with each other. Thus, the heat sink 9 and the substrate mounting member 5 come into surface contact with each other, so that a heat transfer area for heat transfer can be increased, unlike the case where the heat sink 9 and the substrate mounting member 5 come into point contact with each other. Consequently, heat can be efficiently transferred from the light source portion 8 to the substrate mounting member 5.

According to the first embodiment, as hereinabove described, the ribs 4c separated from the rear surface of the heat sink 9 without contact are formed on the front surface of the rear frame 4 to extend in the vertical direction. Thus, the rigidity of the rear frame 4 separated from the heat sink 9 can be easily improved while transfer of the heat from the heat sink 9 to the rear frame 4 is suppressed.

According to the first embodiment, as hereinabove described, the heat sink 9 has an end bent in an L-shape on an opposite side to the substrate mounting member 5 and includes the light source mounting portion 9b configured to mount the light source portion 8 on the end bent in the L-shape, and the light source portion 8 is mounted on the light source mounting portion 9b of the heat sink 9 through the heat radiation tape 8c for heat radiation. Thus, the light source portion 8 is mounted on the light source mounting portion 9b of the heat sink 9 through the heat radiation tape 8c, so that heat can be efficiently transferred from the light source portion 8 to the heat sink 9. In the side edge light type liquid crystal television set 100 in which a side end surface of the light guide plate 12 receives light, the light source portion 8 can be mounted on the light source mounting portion 9b of the heat sink 9 bent in the L-shape along the light guide plate 12, and hence an increase in the thickness of the liquid crystal television set 100 can be suppressed while the heat radiation property is improved.

(Second Embodiment)

The structure of a heat sink 29 of a liquid crystal television set 200 according to a second embodiment of the present invention is now described with reference to FIGS. 10 and 11. In this second embodiment, heat radiation fins 29a are integrally formed on the rear surface of the heat sink 29 in addition to the aforementioned first embodiment in which the rear surface (the surface on the Y2 side) of the heat sink 9 is arranged to come into contact with the front surface (the surface on the Y1 side) of the substrate mounting member 5. The liquid crystal television set 200 and the heat sink 29 are examples of the "display device" and the "heat radiation member" in the present invention, respectively.

Figure 10:
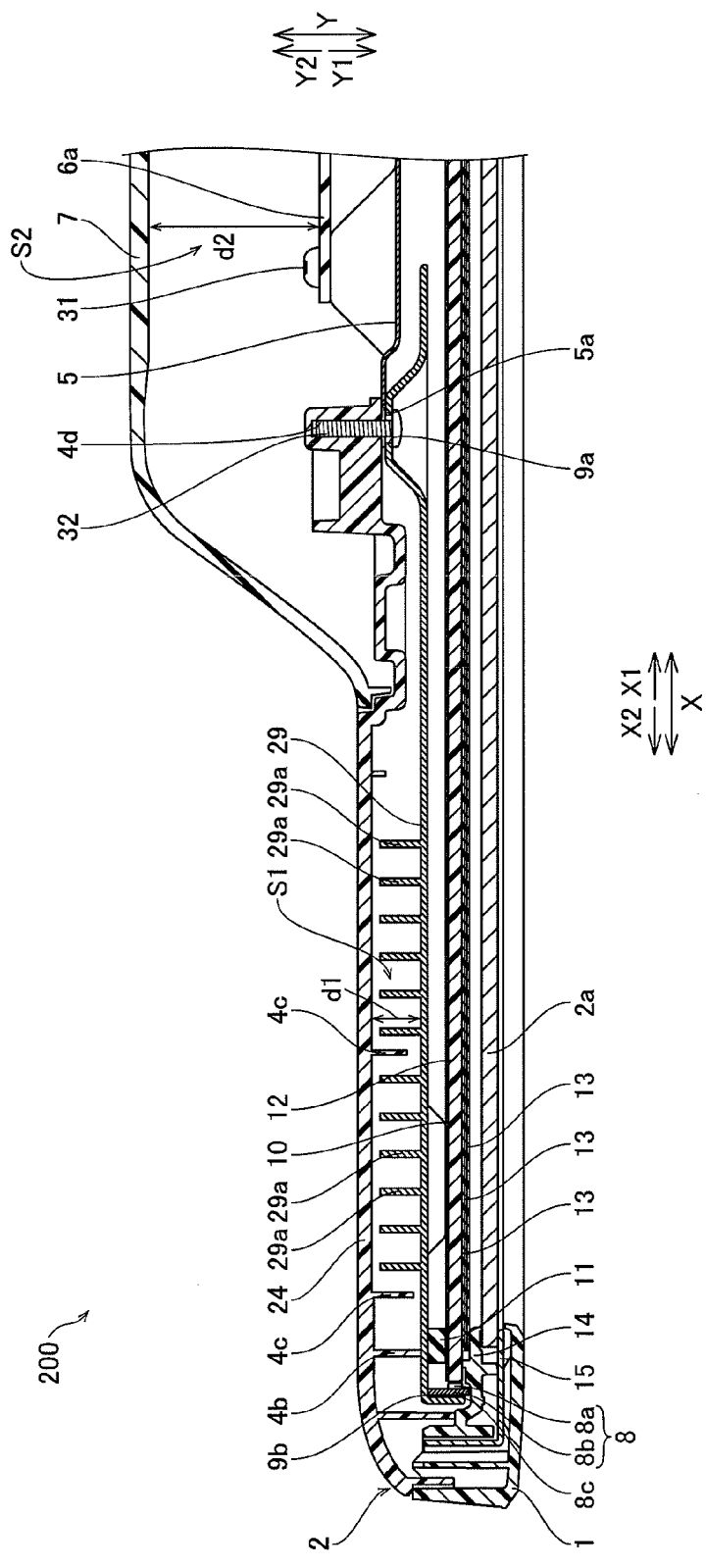
FIG. 10 is a schematic sectional view of a liquid crystal television set according to a second embodiment of the present invention taken horizontally.
Figure 11:
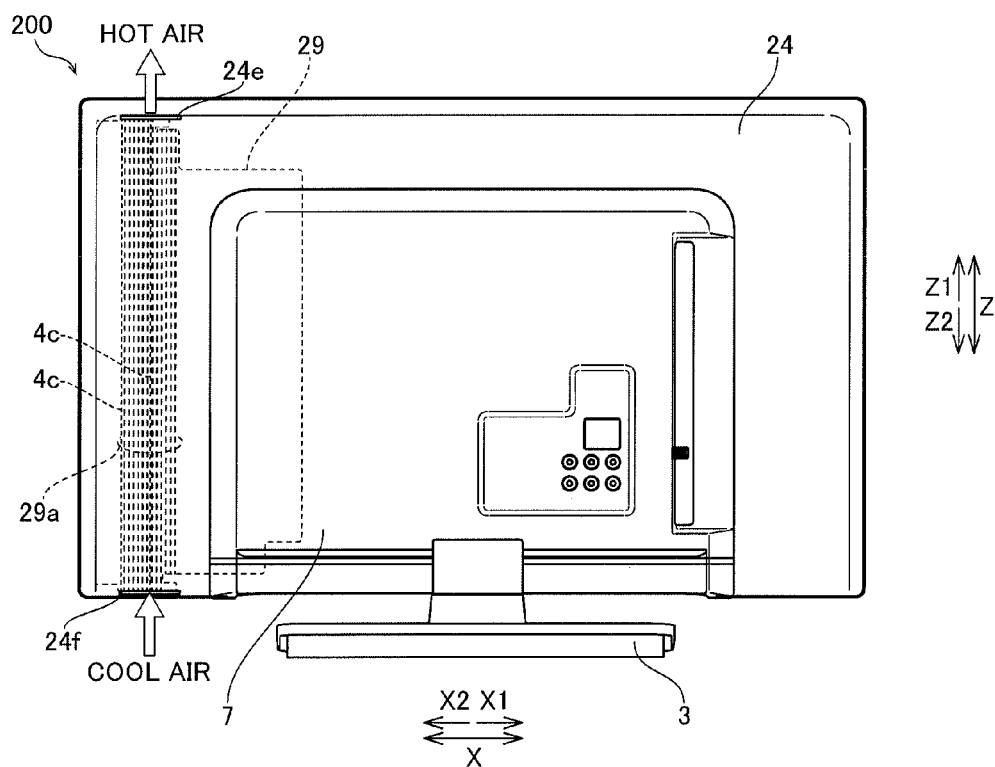
FIG. 11 is a rear view of the liquid crystal television set according to the second embodiment of the present invention.

According to the second embodiment, the heat radiation fins 29a linearly extending in a vertical direction (direction Z) from the upper end of the heat sink 29 to the lower end of the heat sink 29 are formed on the rear surface (a surface on a Y2 side) of the heat sink 29, as shown in FIGS. 10 and 11. These heat radiation fins 29a are formed to protrude and extend from the rear surface of the heat sink 29 toward a rear frame 24 (Y2 side) made of resin, and ends of the heat radiation fins 29a closer to the rear frame 24 are arranged not to come into contact with the front surface of the rear frame 24, as shown in FIG. 10. The rear frame 24 is an example of the "rear housing" in the present invention. The heat radiation fins 29a are arranged at positions not interfering with ribs 4b and 4c extending from the front surface (a surface on a Y1 side) of the rear frame 24 to the heat sink 29 (Y2 side). The ribs 4c of the rear frame 24 according to the second embodiment are formed on the front surface of the rear frame 24 to extend in the vertical direction, similarly to the aforementioned first embodiment. Thus, the ribs 4c of the rear frame 24 according to the second embodiment have not only a function of increasing the rigidity of the rear frame 24 but also a function of facilitating the guiding of relatively hot air in the vicinity of the heat radiation fins 29a to an air hole 24e (see FIG. 11) described later.

According to the second embodiment, the air hole 24e and an air hole 24f are formed in portions of the rear frame 24 corresponding to the upper ends (ends on a Z1 side) and the lower ends (ends on a Z2 side) of the heat radiation fins 29a, respectively, as shown in FIG. 11. Thus, a space S1 (see FIG. 10) between the rear frame 24 and the heat sink 29 is configured in a chimney shape extending in the vertical direction (direction Z) employing the air hole 24e as the upper end and the air hole 24f as the lower end.

According to the second embodiment, heat transferred from a light source portion 8 (see FIG. 10) including LEDs 8a to the heat sink 29 is radiated not only through a substrate mounting member 5 arranged to come into contact with the heat sink 29 but also through the heat radiation fins 29a, and hence air in the vicinity of the heat radiation fins 29a becomes relatively hot. In this case, according to the second embodiment, as hereinabove described, the space S1 (see FIG. 10) between the rear frame 24 and the heat sink 29 is configured in the chimney shape extending in the vertical direction (direction Z), and hence the relatively hot air in the vicinity of the heat radiation fins 29 flows out of the rear frame 24 through the upper air hole 24e of the rear frame 24, and relatively cool air outside the rear frame 24 flows in the rear frame 24 through the lower air hole 24f of the rear frame 24, as shown in FIG. 11. Thus, air in the space S1 (see FIG. 10) between the rear frame 24 and the heat sink 29 is replaced, and the rear frame 24 is cooled. The aforementioned phenomenon of replacing the hot air by the cool air through the space in the chimney shape is called a chimney effect.

The remaining structure of the liquid crystal television set 200 according to the second embodiment is similar to that of the liquid crystal television set 100 according to the aforementioned first embodiment.

According to the second embodiment, as hereinabove described, the heat radiation fins 29a extending in the vertical direction (direction Z) from the upper end of the rear surface of the heat sink 29 to the lower end of the rear surface of the heat sink 29 are integrally formed on the rear surface (the surface on the Y2 side) of the heat sink 29, and the air holes 24e and 24f are formed in the portions of the rear frame 24 corresponding to the upper ends and the lower ends of the heat radiation fins 29a, respectively. Thus, the heat radiation area of the heat sink 29 can be further increased by the surface area of the heat radiation fins 29a, and hence the heat radiation effect of the heat sink 29 can be further improved. Furthermore, the air holes 24e and 24f are formed in the portions of the rear frame 24 corresponding to the upper ends and the lower ends of the heat radiation fins 29a, respectively, whereby the relatively hot air in the vicinity of the heat radiation fins 29a flows out of the rear frame 24 through the upper air hole 24e of the rear frame 24 while the relatively cool air outside the rear frame 24 flows in the rear frame 24 through the lower air hole 24f of the rear frame 24 (chimney effect), and hence the heat radiation effect can be further improved.

According to the second embodiment, as hereinabove described, the heat radiation fins 29a are formed to protrude and extend from the rear surface (the surface on the Y2 side) of the heat sink 29 toward the rear frame 24, and the ends of the heat radiation fins 29a closer to the rear frame 24 are formed to be separated from the front surface (the surface on the Y1 side) of the rear frame 24 without contact. Thus, the heat radiation fins 29a are formed to protrude and extend from the rear surface of the heat sink 29 toward the rear frame 24, whereby the heat radiation area of the heat sink 29 can be further increased, and hence the heat radiation effect of the heat sink 29 can be further improved. Furthermore, the ends of the heat radiation fins 29a closer to the rear frame 24 are formed to be separated from the front surface of the rear frame 24 without contact, whereby transfer of heat generated from the light source portion 8 to the rear frame 24 through the heat sink 29 can be suppressed even in the case where the heat radiation fins 29a are provided.

The remaining effects of the second embodiment are similar to those of the aforementioned first embodiment.

The embodiments disclosed this time must be considered as illustrative in all points and not restrictive. The range of the present invention is shown not by the above description of the embodiments but by the scope of claims for patent, and all modifications within the meaning and range equivalent to the scope of claims for patent are further included.

For example, while the present invention is applied to the liquid crystal television set as the example of the display device in each of the aforementioned first and second embodiments, the present invention is applicable to a common display device such as a display for a PC (personal computer) other than the liquid crystal television set.

While the present invention is applied to the side edge light type liquid crystal television set having the light source portion arranged on the side in each of the aforementioned first and second embodiments, the present invention is also applicable to a back light type liquid crystal television set having a light source portion arranged on the back side.

While the substrate mounting member and the cover member are arranged in the region including the opening of the rear frame (rear housing) in each of the aforementioned first and second embodiments, the present invention is not restricted to this. According to the present invention, a notch may alternatively be formed in the rear frame, and the substrate mounting member and the cover member may alternatively be arranged in a region including the notch of the rear frame.

While the heat sink (heat radiation member) is formed to extend not only in the horizontal direction but also in the vertical direction in each of the aforementioned first and second embodiments, the present invention is not restricted to this. According to the present invention, the heat sink may alternatively be formed to extend only in the horizontal direction so far as the heat sink and the substrate mounting member can come into contact with each other.

While the heat radiation fins extending in the vertical direction from the upper end of the heat sink to the lower end of the heat sink are formed on the rear surface of the heat sink (heat radiation member) in the aforementioned second embodiment, the present invention is not restricted to this. According to the present invention, the extensional direction of the heat radiation fins may alternatively be inclined. The heat radiation fins may alternatively be formed to inclinedly extend from the side of the light source portion to the side of the substrate mounting member as the heat radiation fins go from the lower end of the heat sink to the upper end of the heat sink, for example. Thus, the inclined direction of the heat radiation fins is identical to the heat radiation direction (a direction from the side of the light source portion to the side of the substrate mounting member) of the heat sink, and hence the heat radiation effect can be increased.

While the space is provided between the front surface of the rear frame and the rear surface of the heat sink by providing the rib coming into contact with the rear surface of the heat sink (heat radiation member) on the front surface of the rear frame (rear housing) in each of the aforementioned first and second embodiments, the present invention is not restricted to this. According to the present invention, the space may alternatively be provided between the front surface of the rear frame and the rear surface of the heat sink by arranging a spacer between the front surface of the rear frame and the rear surface of the heat sink.

While the heat sink (heat radiation member) and the substrate mounting member are arranged to come into contact with each other by fastening the heat sink to the rear frame (rear housing) and holding the substrate mounting member between the heat sink and the rear frame in each of the aforementioned first and second embodiments, the present invention is not restricted to this. According to the present invention, the substrate mounting member may not be held between the heat sink and the rear frame so far as the heat sink and the substrate mounting member can be arranged in contact with each other.

What is claimed is:

1. A display device comprising:
a light source portion;
a heat radiation member made of metal, arranged in contact with the light source portion, configured to radiate heat generated from the light source portion;
a rear housing arranged on a rear side of the heat radiation member;
a substrate mounting member made of metal, mounted on the rear housing, mounted with a circuit substrate; and
a cover member, independent of the rear housing, covering the substrate mounting member from a rear side of the substrate mounting member in a state where a rear surface of the rear housing is exposed to an outside, wherein
the heat radiation member contacts the substrate mounting member.

2. The display device according to claim 1, wherein
the rear housing includes a region including an opening or a notch, and
the substrate mounting member and the cover member are mounted on the region including the opening or the notch of the rear housing.

3. The display device according to claim 2, wherein
the light source portion is arranged on a side of the heat radiation member opposite to the substrate mounting member, and
a rear surface of the heat radiation member and a front surface of the rear housing are arranged to be opposed to each other through a space from a side of the light source portion to a side of the substrate mounting member.

4. The display device according to claim 3, wherein
a space ensuring rib or a spacer coming into contact with the rear surface of the heat radiation member, having a prescribe length as a distance from the rear housing to the heat radiation member is arranged on the front surface of the rear housing.

5. The display device according to claim 4, wherein
the space ensuring rib protruding to the heat radiation member to come into contact with the rear surface of the heat radiation member, having the prescribed length is integrally formed on the front surface of the rear housing.

6. The display device according to claim 2, wherein
the rear housing has a rectangular outer shape,
the light source portion is arranged along an end side extending in a vertical direction of the rear housing having the rectangular outer shape,
the substrate mounting member is arranged in a vicinity of a central portion of the rear housing, and
the heat radiation member is formed to extend in a horizontal direction from a side of the light source portion to a side of the substrate mounting member.

7. The display device according to claim 6, wherein
the region including the opening or the notch of the rear housing has a rectangular shape, and
the heat radiation member is formed to extend along the end side extending in the vertical direction of the rear housing having the rectangular outer shape, extend in the horizontal direction from the side of the light source portion to the side of the substrate mounting member, and extend in the vertical direction along an end side extending in the vertical direction of the region including the opening or the notch having the rectangular shape.

8. The display device according to claim 7, wherein
the substrate mounting member has a rectangular shape corresponding to that of the region including the opening or the notch having the rectangular shape of the rear housing, and
the heat radiation member extends in the vertical direction along an end side extending in the vertical direction of the substrate mounting member having the rectangular shape to be longer than the end side extending in the vertical direction of the substrate mounting member.

9. The display device according to claim 7, wherein
a heat radiation fin extending from a vicinity of an upper end of a rear surface of the heat radiation member to a vicinity of a lower end of the rear surface of the heat radiation member is integrally formed on the rear surface of the heat radiation member, and an air hole is formed in each of portions of the rear housing corresponding to an upper end and a lower end of the heat radiation fin.

10. The display device according to claim 9, wherein
the heat radiation fin is formed to protrude and extend from the rear surface of the heat radiation member toward the rear housing, and an end of the heat radiation fin closer to the rear housing is formed to be separated from a front surface of the rear housing without contact.

11. The display device according to claim 1, wherein
the heat radiation member is arranged to come into contact with the substrate mounting member by holding the substrate mounting member between the heat radiation member and the rear housing in a state where the heat radiation member is fastened to the rear housing by a fastening member.

12. The display device according to claim 11, wherein
the substrate mounting member held between the heat radiation member and the rear housing and a vicinity of a portion of the heat radiation member fastened by the fastening member are arranged to come into surface contact with each other.

13. The display device according to claim 1, wherein
a stiffening rib separated from a rear surface of the heat radiation member without contact is formed on a front surface of the rear housing to extend in a vertical direction.

14. The display device according to claim 1, wherein
the heat radiation member has an end bent in an L-shape on an opposite side to the substrate mounting member and includes a light source mounting portion configured to mount the light source portion on the end bent in the L-shape, and
the light source portion is mounted on the light source mounting portion of the heat radiation member through a heat radiation tape for heat radiation.

15. A display device comprising:
a light source portion;
a heat radiation member made of metal, arranged in contact with the light source portion, configured to radiate heat generated from the light source portion;
a rear housing made of resin arranged on a rear side of the heat radiation member;
a substrate mounting member made of metal, mounted on the rear housing, mounted with a circuit substrate; and
a cover member, independent of the rear housing, covering only a part of a rear surface of the rear housing and the substrate mounting member from a rear side of the substrate mounting member in a state where another part of the rear surface of the rear housing is exposed to an outside, wherein
the heat radiation member contacts the substrate mounting member.

16. The display device according to claim 15, wherein
the rear housing includes a region including an opening or a notch, and
the substrate mounting member and the cover member are mounted on the region including the opening or the notch of the rear housing.

17. The display device according to claim 16, wherein
the light source portion is arranged on a side of the heat radiation member opposite to the substrate mounting member, and
a rear surface of the heat radiation member and a front surface of the rear housing are arranged to be opposed to each other through a space from a side of the light source portion to a side of the substrate mounting member.

18. The display device according to claim 17, wherein
a space ensuring rib or a spacer coming into contact with the rear surface of the heat radiation member, having a prescribe length as a distance from the rear housing to the heat radiation member is arranged on the front surface of the rear housing.

19. The display device according to claim 18, wherein
the space ensuring rib protruding to the heat radiation member to come into contact with the rear surface of the heat radiation member, having the prescribed length is integrally formed on the front surface of the rear housing.

20. A display device comprising:
a light source portion;
a heat radiation member made of metal, arranged in contact with the light source portion, configured to radiate heat generated from the light source portion;
a rear housing arranged on a rear side of the heat radiation member;
a substrate mounting member made of metal, mounted on the rear housing, mounted with a circuit substrate; and
a cover member, independent of the rear housing, covering the substrate mounting member from a rear side of the substrate mounting member in a state where a rear surface of the rear housing is exposed to an outside, wherein
the heat radiation member contacts the substrate mounting member, and
the circuit substrate is mounted on the rear side of the substrate mounting member and is arranged to be separated from the cover member by a distance longer than a distance from the rear housing to the heat radiation member.

* * * * *